United States Patent
Lee et al.

(10) Patent No.: US 12,207,421 B2
(45) Date of Patent: *Jan. 21, 2025

(54) CONTROL BOX AND DISPLAY DEVICE INCLUDING THE SAME

(71) Applicant: LG ELECTRONICS INC., Seoul (KR)

(72) Inventors: Gihyung Lee, Seoul (KR); Sangmoon Hwang, Seoul (KR); Joonsub Bae, Seoul (KR); Seokwoo Kwon, Seoul (KR); Yonghan Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/511,207

(22) Filed: Nov. 16, 2023

(65) Prior Publication Data

US 2024/0090144 A1   Mar. 14, 2024

Related U.S. Application Data

(63) Continuation of application No. 17/444,782, filed on Aug. 10, 2021, now Pat. No. 11,864,332.

(30) Foreign Application Priority Data

Jan. 5, 2021 (WO) ................ PCT/KR2021/000086

(51) Int. Cl.
*H05K 5/02* (2006.01)
*G06F 3/147* (2006.01)
(Continued)

(52) U.S. Cl.
CPC .......... *H05K 5/0213* (2013.01); *G06F 3/147* (2013.01); *H05K 7/20136* (2013.01); *H05K 7/2039* (2013.01); *H01Q 1/02* (2013.01)

(58) Field of Classification Search
CPC . G06F 1/181; G06F 1/203; G06F 1/16; G06F 1/20; G06F 1/206; G06F 3/038;
(Continued)

(56) References Cited

U.S. PATENT DOCUMENTS 6,532,152 B1   3/2003   White et al.
7,055,160 B1   5/2006   Tan et al.
(Continued)

FOREIGN PATENT DOCUMENTS

ES   2019505   6/1991
ES   1050058   2/2002
(Continued)

OTHER PUBLICATIONS

European Patent Office Application Serial No. 21190300.0, Search Report dated Feb. 8, 2022, 6 pages.
(Continued)

*Primary Examiner* — Michael A Matey
(74) *Attorney, Agent, or Firm* — LEE, HONG, DEGERMAN, KANG & WAIMEY

(57) ABSTRACT

Disclosed are a control box and a display device including the same. The control box includes a case providing an inner accommodation space and having an opening formed in the upper surface thereof, a first plate supported by the lower surface of the case, a second plate located on the first plate so as to be spaced apart from the first plate, a third plate located on the second plate so as to be spaced apart from the second plate, a rotary plate covering the opening in the case and rotatably mounted to the third plate, and a transceiver located inside the case and coupled to the rotary plate. The display device includes a head including a display panel, and the head exchanges information with the transceiver.

18 Claims, 20 Drawing Sheets

(51) Int. Cl.
*H05K 7/20* (2006.01)
*H01Q 1/02* (2006.01)

(58) Field of Classification Search
CPC ...... G06F 3/04162; H05K 11/00; H05K 7/00; H05K 5/00; H05K 3/00; H02K 1/2793; H02K 9/227
See application file for complete search history.

(56) References Cited

U.S. PATENT DOCUMENTS

| | | |
|---|---|---|
| 8,044,314 B2 | 10/2011 | Weber et al. |
| 8,387,763 B2 | 3/2013 | Burke et al. |
| 10,718,339 B2 | 7/2020 | Patton et al. |
| 2010/0061039 A1 | 3/2010 | Sanford et al. |
| 2011/0216496 A1 | 9/2011 | Benbrahim |
| 2011/0303358 A1 | 12/2011 | Farahani et al. |
| 2011/0304974 A1 | 12/2011 | Knopf et al. |
| 2012/0091798 A1 | 4/2012 | Fleisig |
| 2013/0041297 A1 | 2/2013 | Garcia et al. |
| 2015/0008741 A1 | 1/2015 | Fleisig |
| 2018/0109061 A1 | 4/2018 | Pardhan et al. |
| 2021/0141483 A1 | 5/2021 | Huner et al. |
| 2022/0217855 A1 | 7/2022 | Lee et al. |
| 2023/0007808 A1 | 1/2023 | Lau et al. |

FOREIGN PATENT DOCUMENTS

| | | |
|---|---|---|
| JP | 2902407 | 6/1999 |
| KR | 1020140066114 | 5/2014 |
| KR | 1020160086334 | 7/2016 |
| KR | 1020190060180 | 6/2019 |
| KR | 1020190096593 | 8/2019 |
| KR | 1020200007183 | 1/2020 |
| WO | 2011159473 | 12/2011 |

OTHER PUBLICATIONS

United States Patent and Trademark Office U.S. Appl. No. 17/444,782, Office Action dated Mar. 30, 2023, 19 pages.
United States Patent and Trademark Office U.S. Appl. No. 17/444,782, Notice of Allowance dated Aug. 18, 2023, 9 pages.
PCT International Application No. PCT/KR2021/000086, International Search Report dated Sep. 24, 2021, 3 pages.

CONTROL BOX AND DISPLAY DEVICE INCLUDING THE SAME

CROSS-REFERENCE TO RELATED APPLICATIONS

This application is a continuation of U.S. patent application Ser. No. 17/444,782, filed on Aug. 10, 2021, now pending, which claims the benefit of an earlier filing date and right of priority to International Application No. PCT/KR2021/000086, filed on Jan. 5, 2021, the contents of which are all hereby incorporated by reference herein in their entireties.

BACKGROUND OF THE INVENTION

1. Field of the Invention

The present disclosure relates to a control box and a display device including the same.

2. Description of the Related Art

With the advent of the information society, various demands for display devices are increasing. Various display devices, such as liquid crystal display (LCD) devices, plasma display panel (PDP) devices, electroluminescent display (ELD) devices, vacuum fluorescent display (VFD) devices, and organic light-emitting diode (OLED) devices, have been recently studied and used in response to various demands for display devices.

Thereamong, a display device using an organic light-emitting diode (OLED) is advantageous in that it has better luminance characteristics and viewing angle characteristics than a liquid crystal display device, and has an ultra-thin profile because it does not require a backlight unit, unlike the liquid crystal display device.

A control box may be positioned so as to be spaced apart from a display device and adjacent to a user so as to be used by the user. The control box may provide various pieces of information to the display device. For example, the control box may be an AV box. The control box may exchange information with a display head, which is provided with a display panel displaying an image, in a wired/wireless manner.

Recently, various studies have been conducted on the connectivity of such a display device.

SUMMARY OF THE INVENTION

It is an object of the present disclosure to solve the above and other problems.

It is another object of the present disclosure to provide a control box configured to be wirelessly connected to a head provided with a display panel.

It is still another object of the present disclosure to provide a stacked structure of components of a control box.

It is still another object of the present disclosure to provide a mechanism capable of improving the reception rate of an antenna of a wireless control box.

It is still another object of the present disclosure to provide a structure capable of effectively dissipating the heat generated in a wireless control box.

In order to accomplish the above and other objects, a control box according to one aspect of the present disclosure may include a case providing an inner accommodation space and having an opening formed in the upper surface thereof, a first plate supported by the lower surface of the case, a second plate located on the first plate so as to be spaced apart from the first plate, a third plate located on the second plate so as to be spaced apart from the second plate, a rotary plate covering the opening in the case and rotatably mounted to the third plate, and a transceiver located inside the case and coupled to the rotary plate.

A display device according to another aspect of the present disclosure may include a head including a display panel, and the head may exchange information with the transceiver.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE PREFERRED EMBODIMENTS

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the present application, it should be understood that the terms "comprises," "includes," "has," etc. specify the presence of features, numbers, steps, operations, elements, components, or combinations thereof described in the specification, but do not preclude the presence or addition of one or more other features, numbers, steps, operations, elements, components, or combinations thereof.

Figure 1:
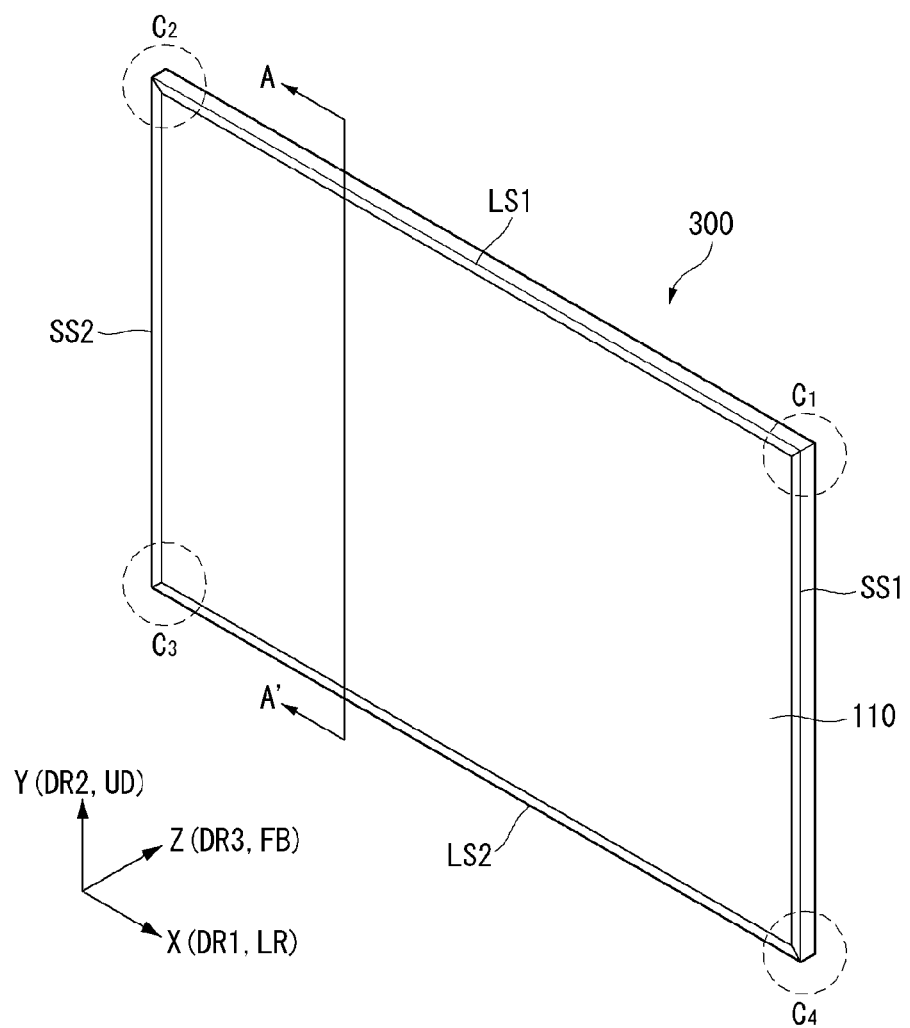
FIGS. 1 to 20 are views showing examples of a display device according to embodiments of the present disclosure.

Referring to FIG. 1, a display device head 300 may include a first long side LS1, a second long side LS2 opposite the first long side LS1, a first short side SS1 adjacent to the first long side LS1 and the second long side LS2, and a second short side SS2 opposite the first short side SS1.

The first short side area SS1 of the display device head 300 may be referred to as a first side area, and the second short side area SS2 of the display device head 300 may be referred to as a second side area opposite the first side area. The first long side area LS1 of the display device head 300 may be referred to as a third side area adjacent to the first side area and the second side area and located between the first side area and the second side area, and the second long side area LS2 of the display device head 300 may be referred to as a fourth side area adjacent to the first side area and the second side area, located between the first side area and the second side area, and opposite the third side area.

Although the length of each of the first and second long sides LS1 and LS2 is shown and described as being greater than the length of each of the first and second short sides SS1 and SS2 for convenience of description, the length of each of the first and second long sides LS1 and LS2 may be approximately equal to the length of each of the first and second short sides SS1 and SS2.

In the following description, a first direction DR1 may be a direction parallel to the long sides LS1 and LS2 of a display panel 110, and a second direction DR2 may be a direction parallel to the short sides SS1 and SS2 of the display panel 110. A third direction DR3 may be a direction perpendicular to the first direction DR1 and/or the second direction DR2.

The side of the display device head 300 at which an image is displayed may be referred to as a front or a front surface. The side of the display device head 300 at which an image is not observed when the display device head 300 displays the image may be referred to as a rear or a rear surface. When the display device head 300 is seen from the front or the front surface, the first long side portion LS1 may be referred to as an upper side or an upper surface, and the second long side portion LS2 may be referred to as a lower side or a lower surface. When the display device head 300 is seen from the front or the front surface, the first short side portion SS1 may be referred to as a right side or a right surface, and the second short side portion SS2 may be referred to as a left side or a left surface.

The first long side LS1, the second long side LS2, the first short side SS1, and the second short side SS2 may be referred to as edges of the display device head 300. In addition, the points at which the first long side LS1, the second long side LS2, the first short side SS1, and the second short side SS2 join may be referred to as corners. For example, the point at which the first long side LS1 and the first short side SS1 join may be referred to as a first corner C1, the point at which the first long side LS1 and the second short side SS2 join may be referred to as a second corner C2, the point at which the second short side SS2 and the second long side LS2 join may be referred to as a third corner C3, and the point at which the second long side LS2 and the first short side SS1 join may be referred to as a fourth corner C4.

The direction from the first short side SS1 to the second short side SS2 or the direction from the second short side SS2 to the first short side SS1 may be referred to as a leftward-rightward direction LR or a horizontal direction DR1. The direction from the first long side LS1 to the second long side LS2 or the direction from the second long side LS2 to the first long side LS1 may be referred to as an upward-downward direction UD or a vertical direction DR2.

In addition, the direction from the front surface to the rear surface or the direction from the rear surface to the front surface may be referred to as a forward-rearward direction DR3 or a thickness direction FB. The forward-rearward direction DR3 may be a direction perpendicular to the leftward-rightward direction LR and/or the upward-downward direction UD.

Figure 2:
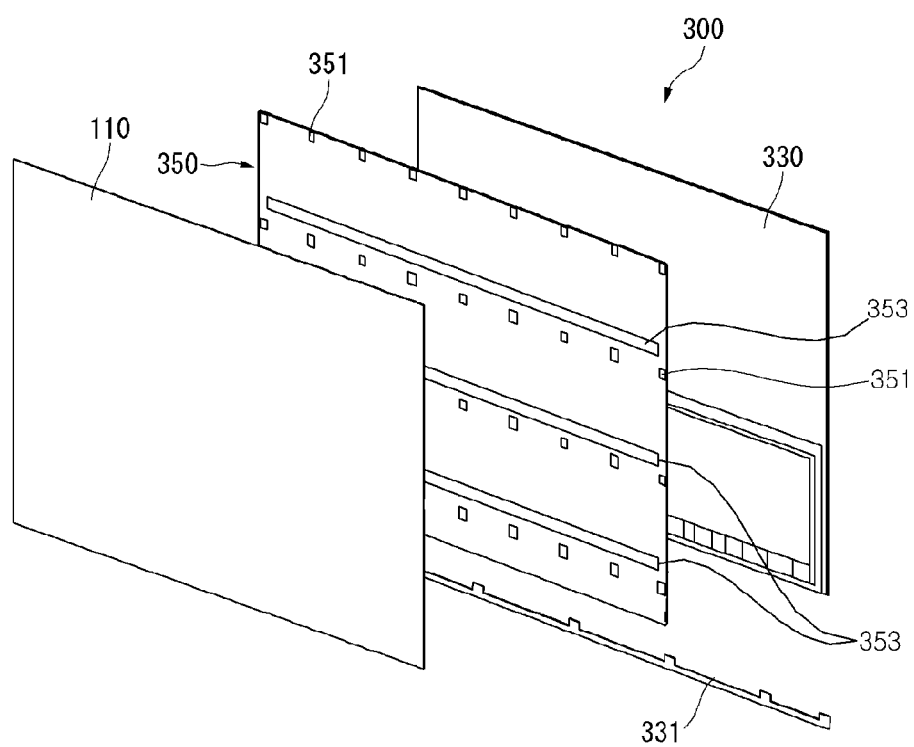
Figure 3:
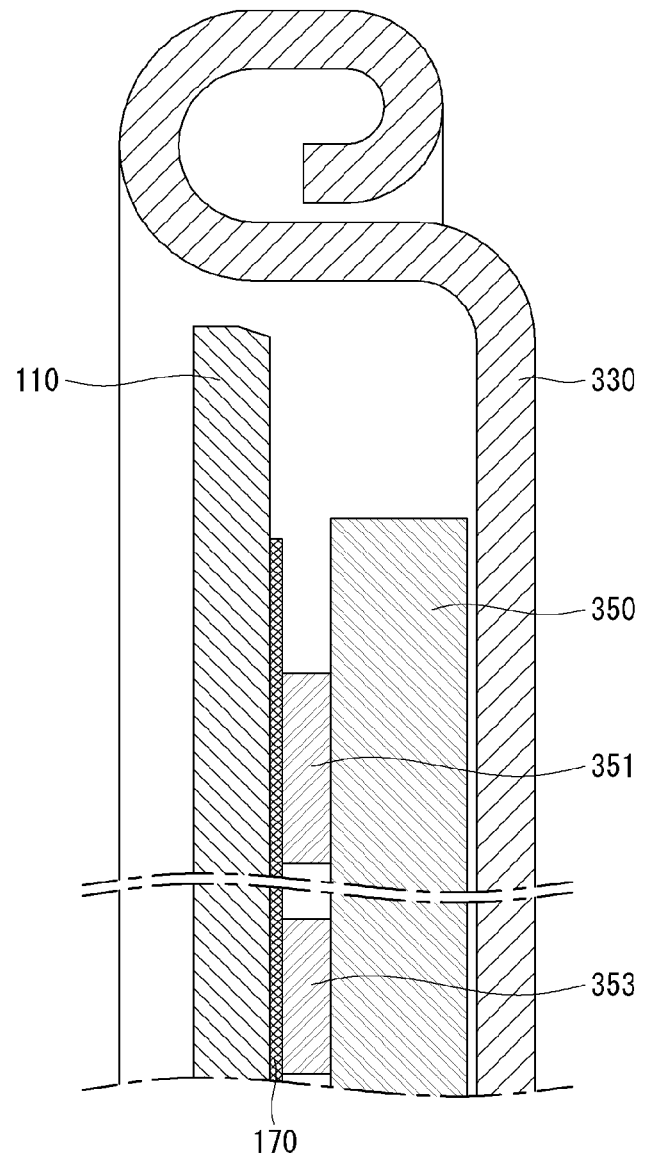

Referring to FIGS. 2 and 3, the display device head 300 may include a display panel 110, a main frame 330, and an inner plate 350.

The display panel 110 may be provided at the front surface of the display device head 300, and may display an image.

The main frame 330 may be disposed at the rear of the display panel 110. The main frame 330 may be coupled to the display panel 110. The edge of the main frame 330 may be bent at least once.

The main frame 330 may include a bottom frame 331. The bottom frame 331 may be disposed at the lower end of the main frame 330. The bottom frame 331 may be separated from or coupled to the main frame 330. The main frame 330 and the bottom frame 331 may cover the lower surface of the display panel 110.

The inner plate 350 may be disposed at the rear of the display panel 110. The inner plate 350 may be disposed between the display panel 110 and the main frame 330. The front surface of the inner plate 350 may face the display panel 110. The rear surface of the inner plate 350 may be fixed or coupled to the main frame 330.

The inner plate 350 may face a support plate 170, which is mounted to the rear surface of the display panel 110. The inner plate 350 may be connected or coupled to the support plate 170 via coupling members 351 and 353.

Coupling portions 351 may be formed at the inner plate 350 in a distributed arrangement. The coupling portions 351 may be uniformly distributed over the entire area of the inner plate 350. The coupling portions 351 may be provided for coupling between the inner plate 350 and the main frame 330.

Adhesive members 353 may be disposed on the front area of the inner plate 350. The adhesive members 353 may be disposed between the coupling portions 351. For example, each of the adhesive members 353 may be a piece of double-sided tape. A plurality of adhesive members 353 may be disposed so as to extend in the horizontal direction of the inner plate 350. The plurality of adhesive members 353 may be spaced apart from each other in the vertical direction.

Figure 4:
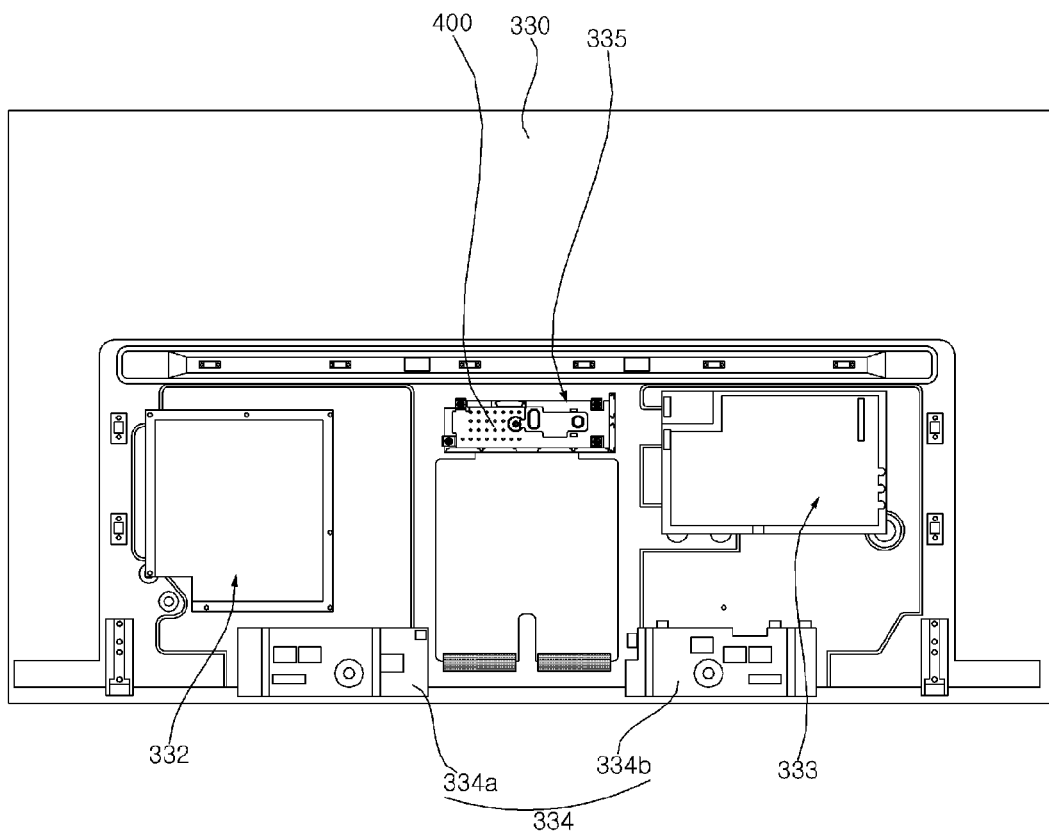

Referring to FIG. 4, a power supply 332 may be mounted to the right portion of the rear surface of the frame 330. A main board 333 may be mounted to the left portion of the rear surface of the frame 330. A speaker 334 may be provided in a pair. The pair of speakers 334a and 334b may be mounted beside each other on the rear surface of the lower portion of the frame 330.

A T-CON board 335 may be mounted to the center of the rear surface of the frame 330. The T-CON board 335 may be located between the power supply 332 and the main board 333. The shield plate 400 may be mounted on the T-CON board 335. The shield plate 400 may be spaced apart from the T-CON board 335, and may be mounted to the frame 330 so as to cover the upper side of the T-CON board 335. The shield plate 400 may also be mounted over the main board 333 and the power supply 332.

Figure 5:
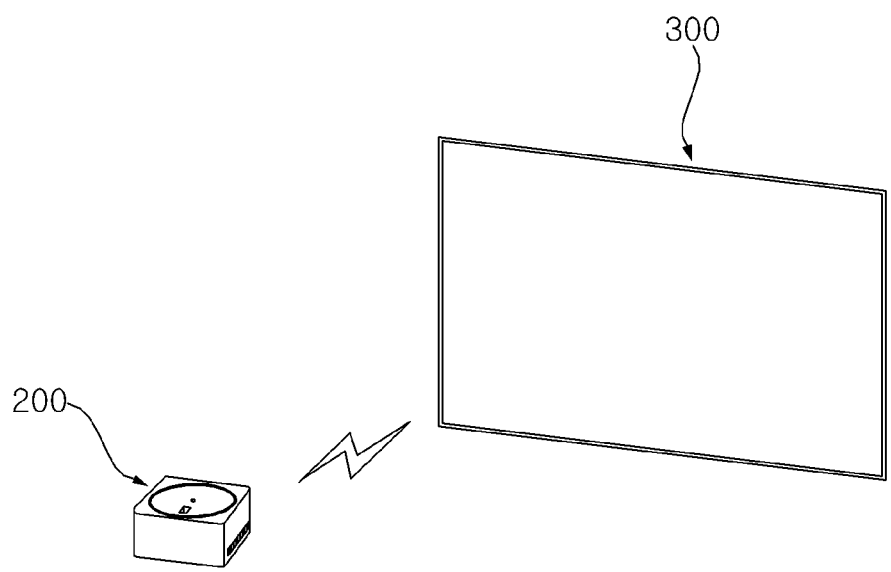

Referring to FIG. 5, the control box 200 may be located apart from the display device head 300. The control box 200 may be referred to as a set-top box 200. The control box 200 may exchange information with the display device head 300 in a wireless manner. The stability of wireless communication between the control box 200 and the display device head 300 may vary depending on the relative positions of the control box 200 and the display device head 300.

The position at which the display device head 300 is located may be constant in order to maintain a predetermined distance from a user. With regard to the control box 200, for user convenience, it is required to increase the freedom with which the position of the control box 200 may be adjusted.

Figure 6:
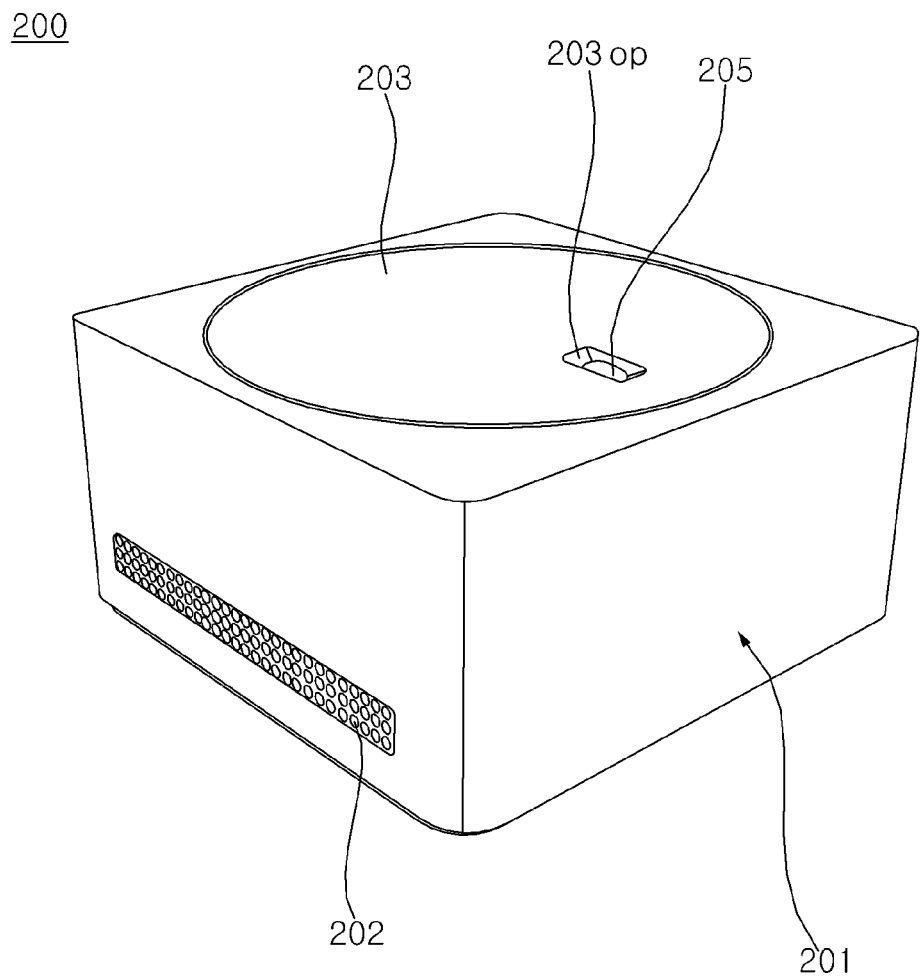
Figure 7:
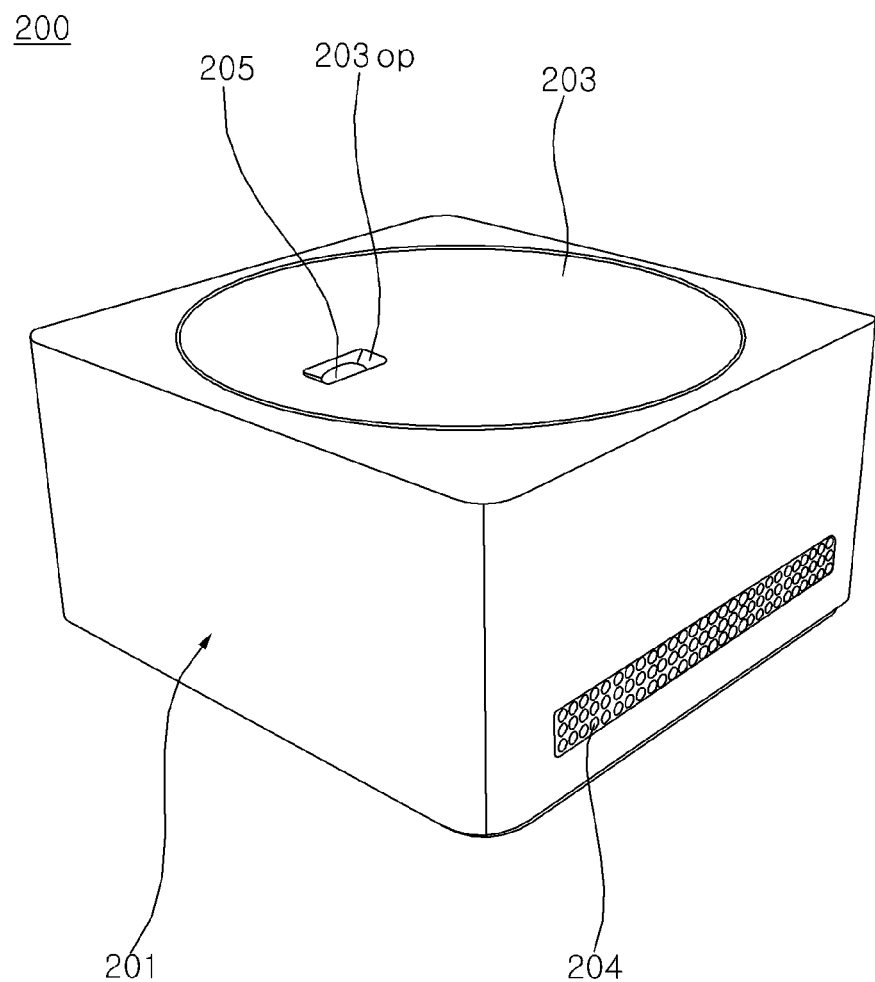
Figure 8:
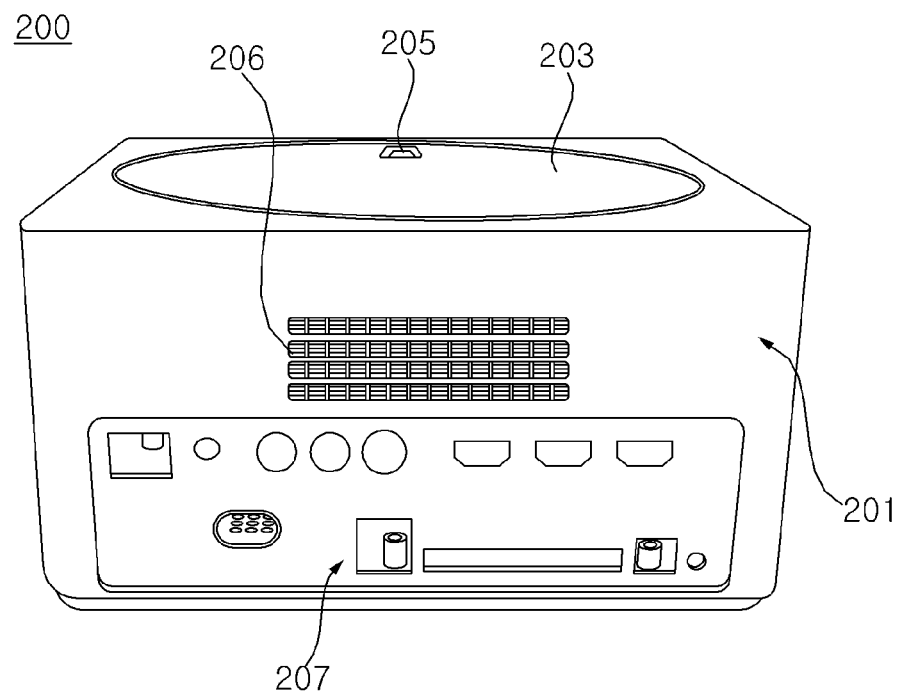

Referring to FIGS. 6 to 8, the case 201 of the control box may have a rectangular box shape overall. A rotary plate 203 may be rotatably mounted to the top surface of the case 201. The rotary plate 203 may have a circular plate shape. The rotary plate 203 may have an opening 203op formed in a portion adjacent to the outer circumference thereof. The opening 203op may extend in the diameter direction of the rotary plate 203. A dial 205 may be mounted inside the case 201. The dial 205 may be exposed to the outside of the case 201 through the opening 203op. The dial 205 may be formed to be movable in the longitudinal direction of the opening 203op.

A first introduction hole 202 may be formed in the left surface of the case 201. The first introduction hole 202 may be adjacent to the lower end of the left surface of the case 201. The first introduction hole 202 may be formed such that a plurality of holes is arranged in a long row along the lower edge of the left surface of the case 201. A second introduction hole 204 may be formed in the right surface of the case 201. The second introduction hole 204 may be adjacent to the lower end of the right surface of the case 201. The second introduction hole 204 may be formed such that a plurality of holes is arranged in a long row along the lower edge of the right surface of the case 201.

A discharge hole 206 may be formed in the rear surface of the case 201. A plurality of terminal holes may be formed in the rear surface of the case 201. The discharge hole 206 may be located at the upper portion of the rear surface of the case 201, and the plurality of terminal holes 207 may be located at the lower portion of the rear surface of the case 201.

Figure 9:
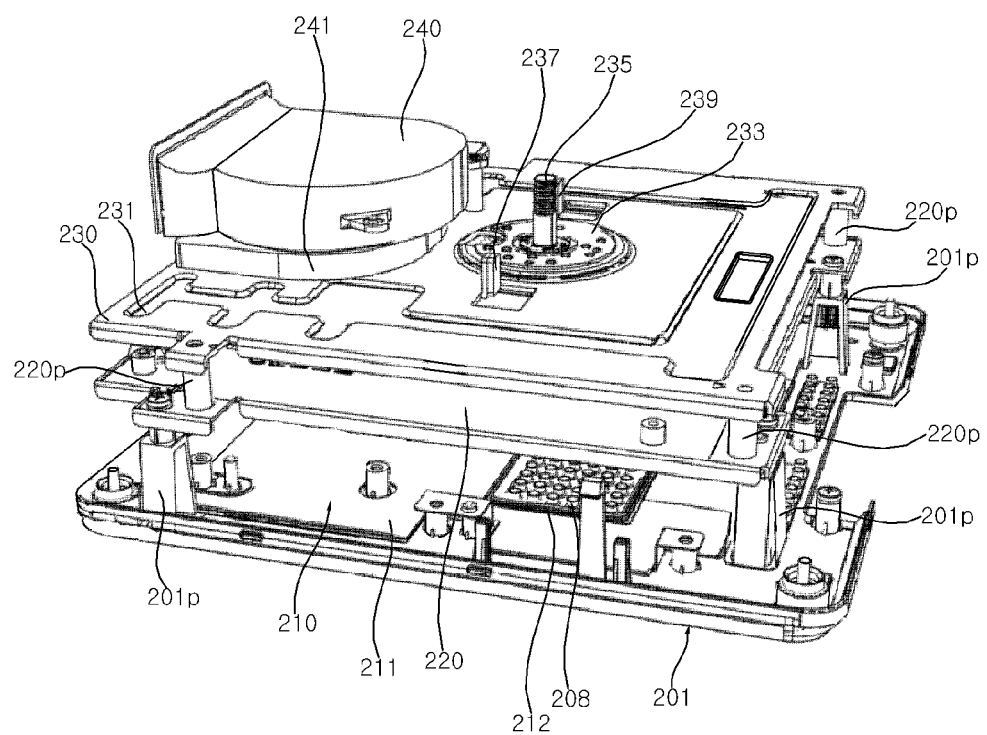

Referring to FIG. 9, a first plate 210 may be located on the bottom surface of the case 201. The first plate 210 may include metal. An insulating layer 211 may be located on the upper surface of the first plate 210. The insulating layer 211 may be an insulating sheet adhered to the upper surface of the first plate 210, or may be a synthetic resin layer applied to the upper surface of the first plate 210.

A third introduction hole 208 may be formed in the bottom of the case 201. The third introduction hole 208 may include a plurality of holes. The first plate 210 may have an opening 212 formed therein at a position corresponding to the third introduction hole 208. The opening 212 may be formed by punching a portion of the first plate 210, or may be formed by cutting out a portion of the first plate 210.

A second plate 220 may be located above the first plate 210 so as to be spaced apart from the first plate 210. The second plate 220 may be fixed to pillars 201P formed on the bottom surface of the case 201.

A third plate 230 may be located above the second plate 220 so as to be spaced apart from the second plate 220. The third plate 230 may be fixed to pillars 220P formed on the second plate 220. The third plate 230 may be pressed to form a forming portion 231 therein. Accordingly, the third plate 230 may exhibit enhanced torsional rigidity and bending rigidity. A rotation support 233 may be formed on the third plate 230, and a rotary shaft 235 may be formed at the rotation support 233. Stoppers 237 and 239 may be located opposite each other with respect to the rotary shaft 235. The stoppers 237 and 239 and the rotary shaft 235 may be aligned in a line.

A fan 240 may be coupled to the third plate 230. A shock absorber 241 may be located between the third plate 230 and the fan 240. The shock absorber 241 may be adhered to or in contact with the third plate 230, and may be in contact with the fan 240. For example, the shock absorber 241 may be a piece of rubber or sponge.

Figure 10:
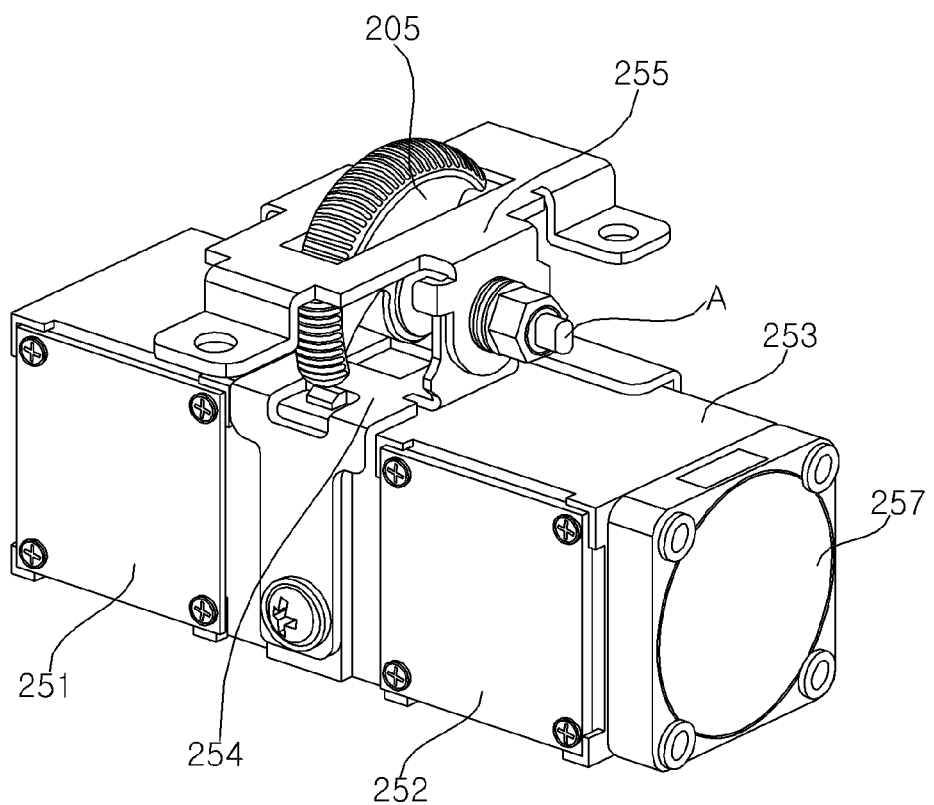

Referring to FIG. 10, a transceiver 250 may include antennas 251 and 252, a heat sink 253, a cooling fan 257, a dial 205, and brackets 254 and 255. The heat sink 253 may have an oblong rectangular column shape. The first antenna 251 may be coupled to one surface of the heat sink 253. The second antenna 252 may be coupled to the one surface of the heat sink 253 so as to be located beside the first antenna 251. The front surface of each of the antennas 251 and 252 may be oriented toward the outside, and at least a portion of the rear surface of each of the antennas 251 and 252 may be in contact with the heat sink 253.

The cooling fan 257 may be coupled to one side of the heat sink 253. The cooling fan 257 may draw external air so that the external air passes through the heat sink 253. Accordingly, it may be possible to effectively dissipate the heat generated from the antennas 251 and 252.

The first bracket 254 may be coupled to the upper side of the heat sink 253. The second bracket 255 may be connected to the first bracket 254 so as to be pivotable with respect to the first bracket 254. A connection shaft A may be mounted through the first bracket 254 and the second bracket 255. The dial 205 may be rotatably mounted to the connection shaft A. The dial 205 may rotate with respect to the second bracket 255. When the dial 205 rotates, the first bracket 254 may move together therewith. For example, the dial 205 may have a semicircular shape. The circular arc surface of the dial 205 may be exposed to the outside through the second bracket 255, and the diameter surface of the dial 205 may be supported by the first bracket 254. Accordingly, when the dial 205 is turned, the heat sink 253 may pivot with respect to the second bracket 255.

Figure 11:
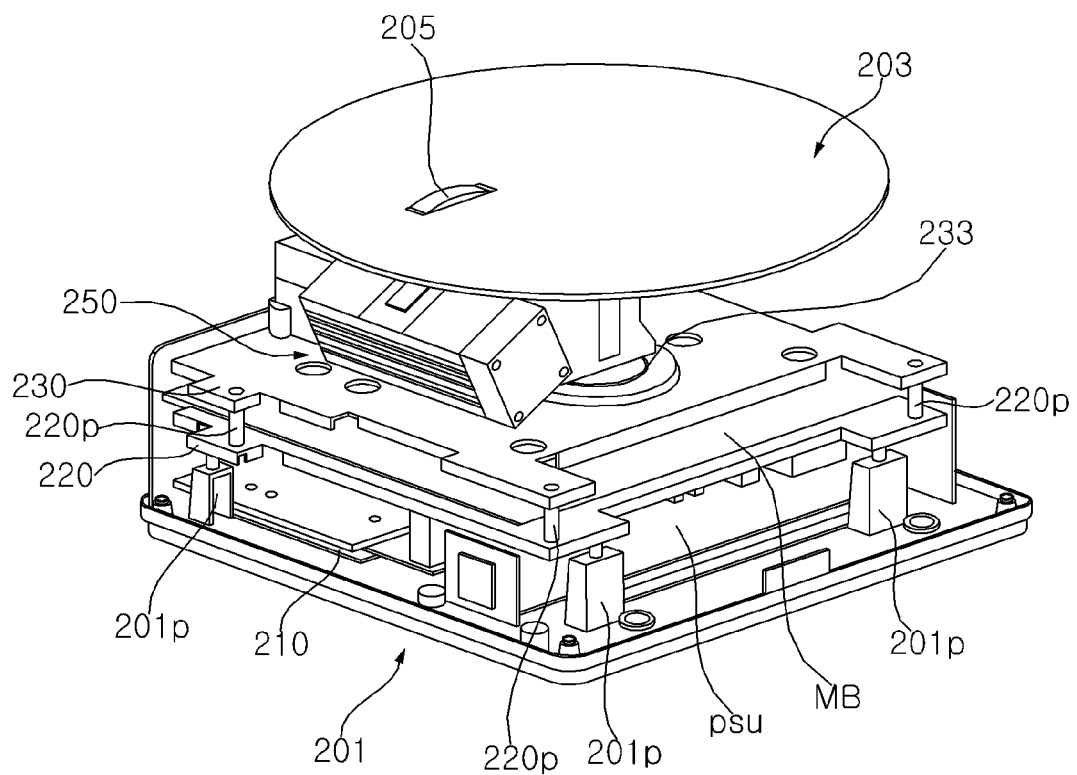

Referring to FIG. 11, a power supply PSU may be disposed between the first plate 210 and the second plate 220. The power supply PSU may be fixed to the first plate 210, and may be spaced apart from the second plate 220. The power supply PSU may be located closer to the first plate 210 than to the second plate 220. Accordingly, the heat generated from the power supply PSU may be transferred to the first plate 210 to be dissipated thereby, and may also be removed in an air-cooling manner by air flowing through the space between the second plate 220 and the power supply PSU.

A main board MB may be disposed between the second plate 220 and the third plate 230. The main board MB may be fixed to the second plate 220, and may be spaced apart from the third plate 230. The main board MB may be located closer to the second plate 220 than to the third plate 230. The main board MB may generate a larger amount of heat than the power supply PSU.

The rotary plate 203 may be rotatably mounted to the third plate 230. The transceiver 250 may be located between the rotary plate 203 and the third plate 230. The transceiver 250 may rotate together with the rotary plate 203. Further, the antennas 251 and 252 may pivot together with the dial 205. Accordingly, the antennas 251 and 252 may rotate or pivot in leftward-rightward and upward-downward directions.

Figure 12:
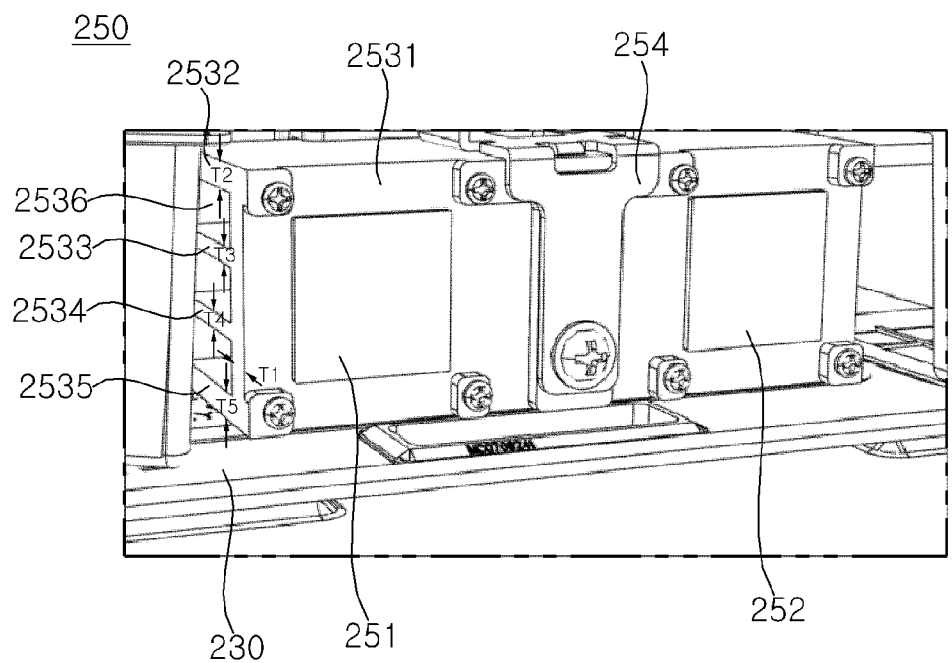
Figure 13:
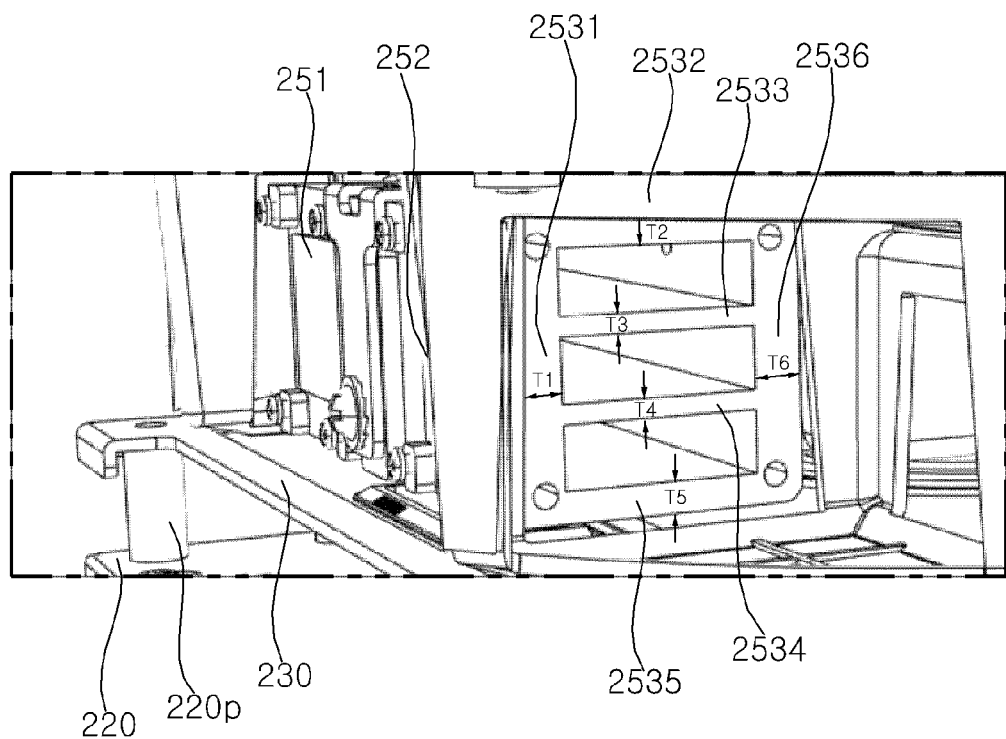

Referring to FIGS. 12 and 13, the heat sink 253 may include a front part 2531, a rear part 2536, a top part 2532, a bottom part 2535, and fins 2533 and 2534. The antennas 251 and 252 may be mounted to the front part 2531, and may be in contact with the front part 2531. The rear part 2536 may be spaced apart from the front part 2531 so as to be opposite the front part 2531. The top part 2532 may interconnect the upper end of the front part 2531 and the upper end of the rear part 2536. The bottom part 2535 may interconnect the lower end of the front part 2531 and the lower end of the rear part 2536. The bottom part 2535 may be spaced apart from the top part 2532 so as to be opposite the top part 2532. For example, the front part 2531, the rear part 2536, the top part 2532, and the bottom part 2535 may together form a hollow rectangular pillar.

The front part 2531, the rear part 2536, the top part 2532, and the bottom part 2535 may be referred to as sink boxes 2531, 2532, 2535 and 2536. The thicknesses T1, T2, T5 and T6 of the front part 2531, the rear part 2536, the top part 2532, and the bottom part 2535 may be substantially the same as each other.

The first fin 2533 may be disposed between the top part 2532 and the bottom part 2535 so as to be parallel to the same, and may interconnect the front part 2531 and the rear part 2536. The second fin 2534 may be disposed between the first fin 2533 and the bottom part 2535 so as to be parallel to the same, and may interconnect the front part 2531 and the rear part 2536. The thickness T3 of the first fin 2533 may be substantially the same as the thickness T4 of the second fin 2534. Each of the thicknesses T1, T2, T5 and T6 of the sink boxes 2531, 2532, 2535 and 2536 may be greater than the thickness T3 of the first fin 2533 and/or the thickness T4 of the second fin 2534. Accordingly, the heat dissipation effect of the heat sink 253 may be improved. Although the heat sink 253 is described as including two fins 2533 and 2534, the number of fins is not limited to two.

Figure 14:
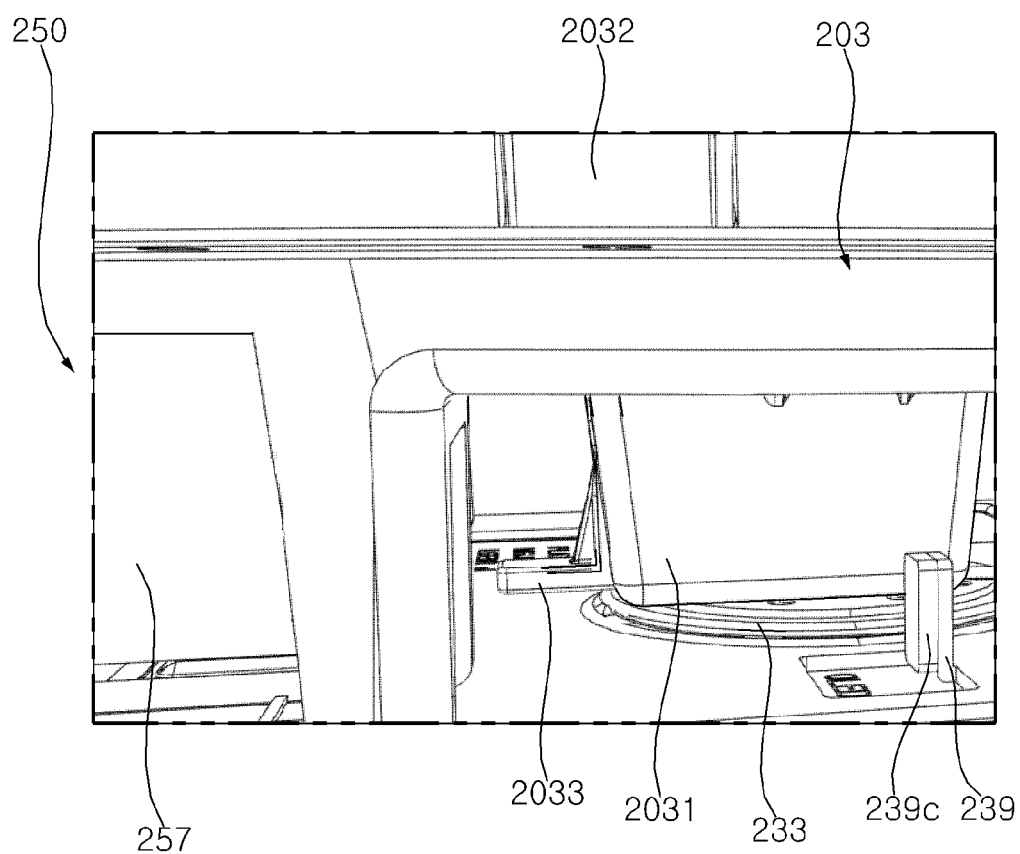
Figure 15:
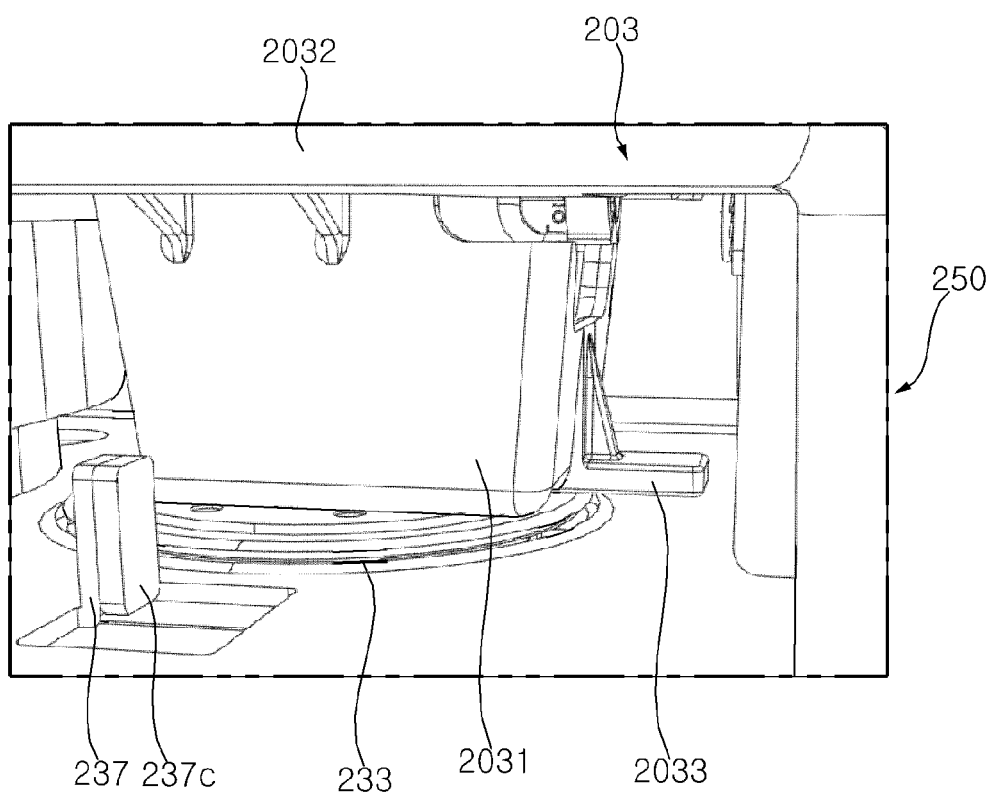

Referring to FIGS. 14 and 15, the rotary plate 203 may include an upper plate 2032 and a rotary pillar 2031. The upper plate 2032 may have a circular plate shape, and the rotary pillar 2031 may extend from the lower surface of the upper plate 2032. The rotary pillar 2031 may rotate on the rotation support 233.

The rotary pillar 2031 may be coupled to the rotary shaft 235 described above with reference to FIG. 9. A rib 2033 may protrude and extend outwards from the rotary pillar 2031. The rib 2033 may extend from the rotary pillar 2031 toward the transceiver 250.

When the rotary plate 203 rotates, the rotational angle thereof may be limited by contact of the rib 2033 with the first stopper 237 or the second stopper 239. For example, the rotational angle may be 180 degrees. A first cushion 237C may be fixed to the first stopper 237, and the rib 2033 may come into contact with the first cushion 237C. A second cushion 239C may be fixed to the second stopper 239, and the rib 2033 may come into contact with the second cushion 239C.

Figure 16:
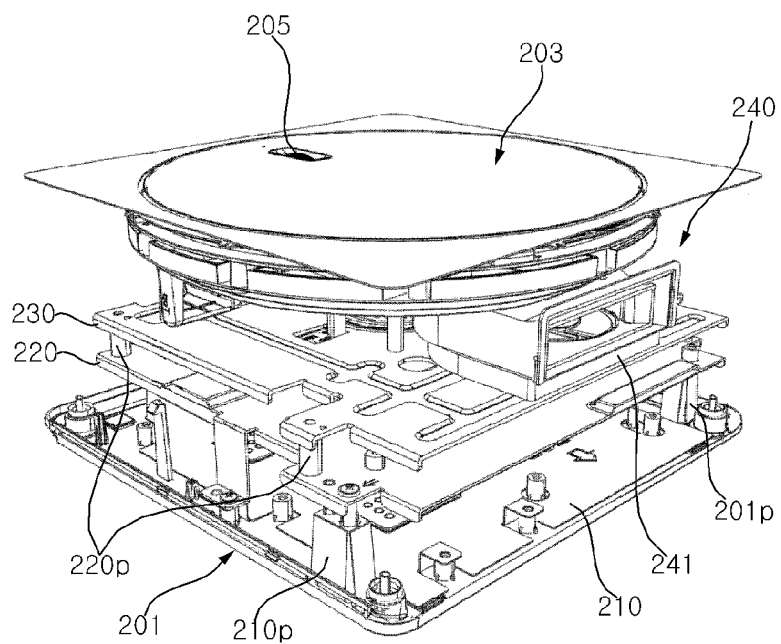
Figure 17:
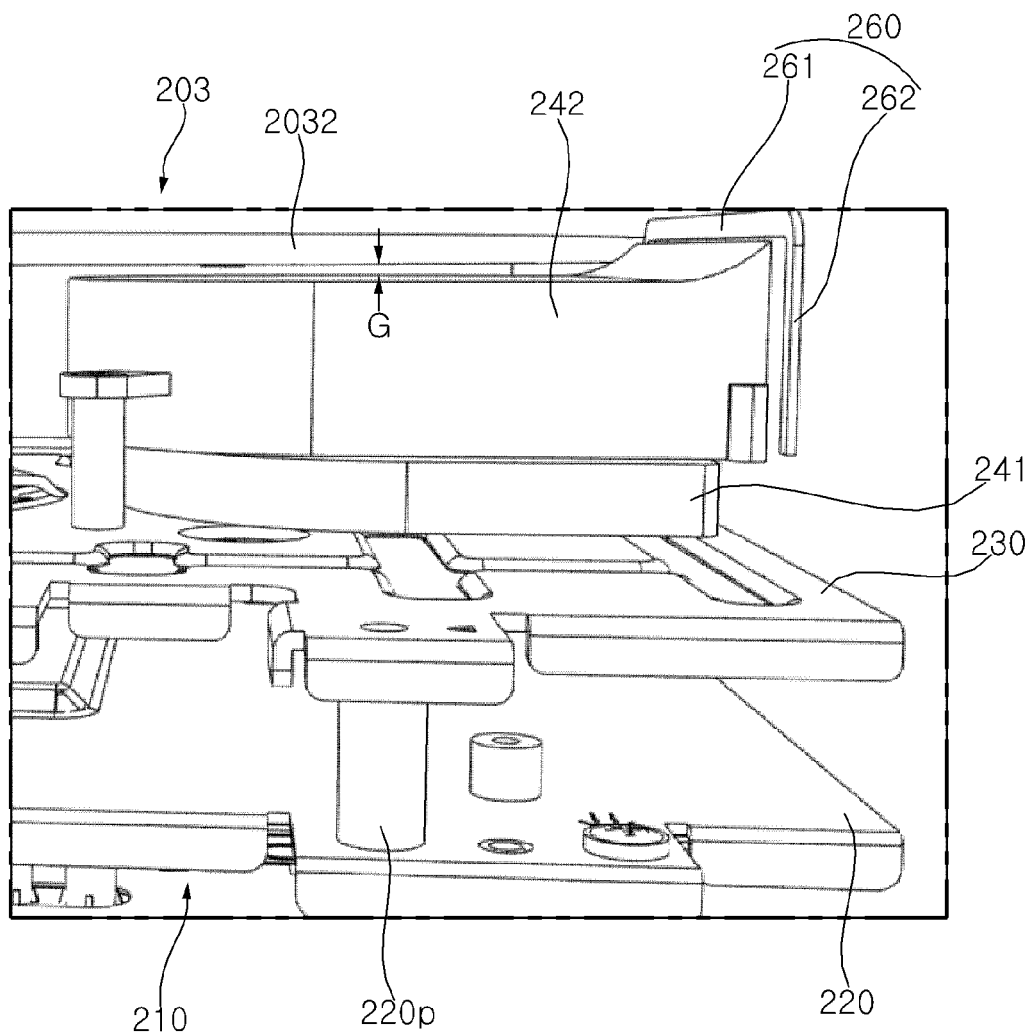
Figure 18:
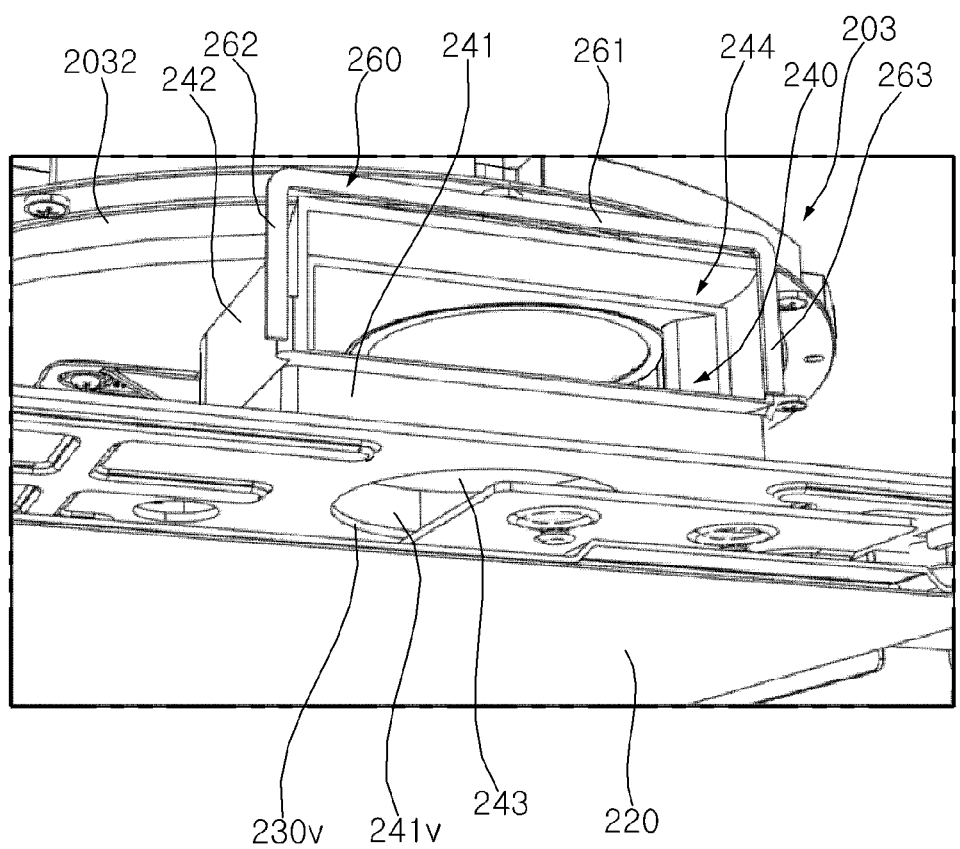

Referring to FIGS. 16 to 18, the fan 240 may include a housing 242, an inlet 243, and an outlet 244. For example, the fan 240 may be a sirocco fan. The shock absorber 241 may be fixed to the upper surface of the third plate 230. The housing 242 of the fan 240 may be located on the shock absorber 241. The shock absorber 241 may include a hollow flow passage 241V. The third plate 230 may have therein an opening 230V corresponding to the flow passage 241V in the shock absorber 241. The inlet 243 of the fan 240 may communicate with the opening 230V in the third plate 230 and the flow passage 241V in the shock absorber 241. The housing 242 may have an open area defining the outlet 244 of the fan 240.

The heat generated in the region under the third plate 230 may flow to the outlet 244 of the housing 242 via the opening 230V in the third plate 230, the flow passage 241V in the shock absorber 241, and the inlet 243 of the housing 242. The upper surface of the housing 242 may be spaced apart from the upper plate 2032 of the rotary plate 203. A gap G may be formed between the upper surface of the housing 242 and the upper plate 2032 of the rotary plate 203. An airflow path may be created between the upper surface of the housing 242 and the upper plate 2032 of the rotary plate 203 due to the pressure difference generated by the strong discharge of air through the outlet 244 of the fan 240.

A discharge guide 260 may be disposed on the outer periphery of the outlet 244 of the fan 240. The discharge guide 260 may include a first part 261, a second part 262, and a third part 263. The outlet 244 of the fan 240 may have an elongated rectangular shape. The first part 261 may extend along the long edge of the outlet 244 of the fan 240. The second part 262 may be bent from one end of the first part 261, and may extend along one short edge of the outlet 244 of the fan 240. The third part 263 may be bent from the opposite end of the first part 261, and may extend along the opposite short edge of the outlet 244 of the fan 240. Accordingly, it may be possible to prevent the air discharged from the outlet 244 of the fan 240 from flowing reversely.

Figure 19:
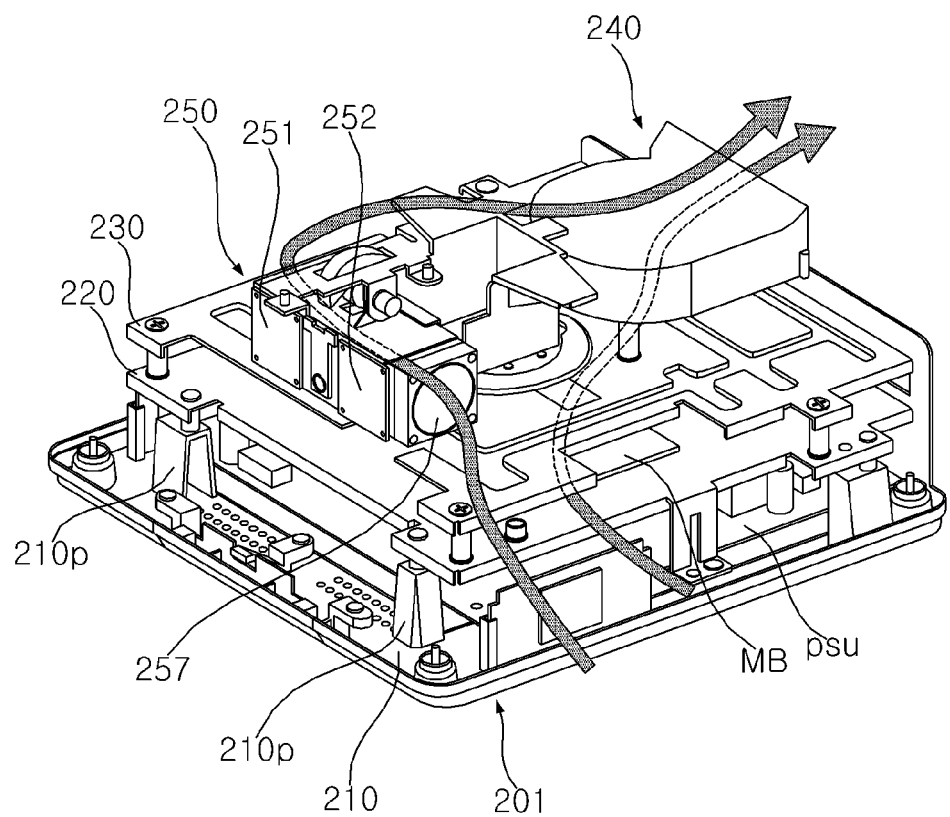
Figure 20:
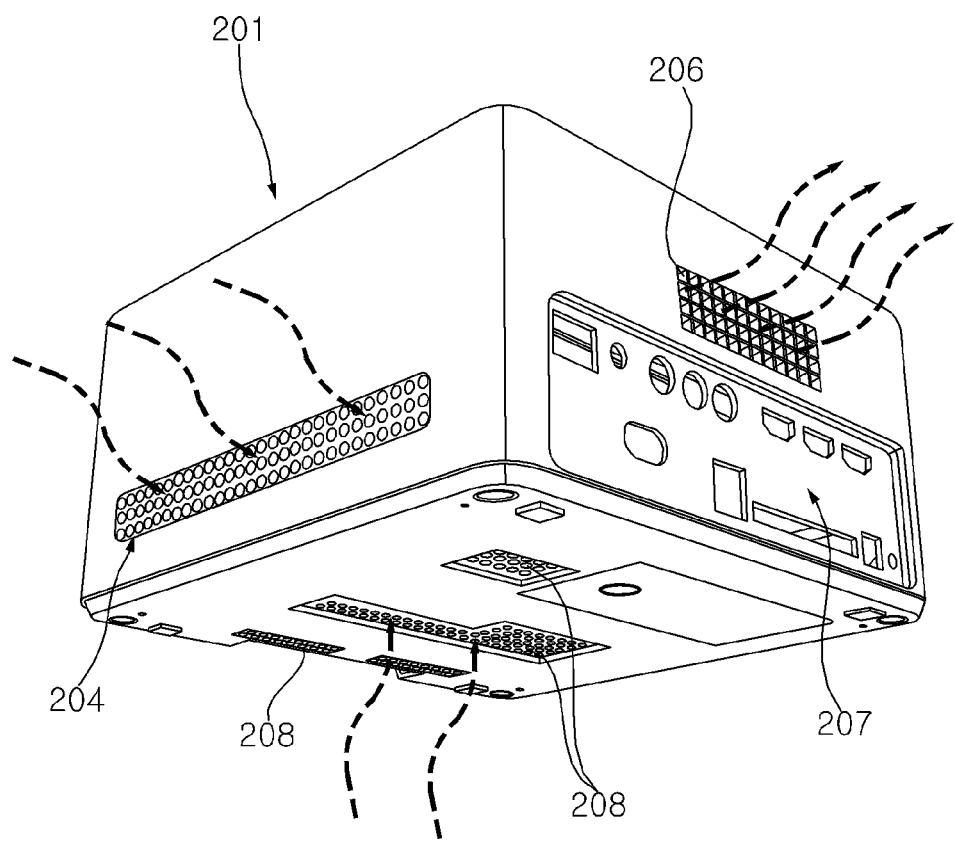

Referring to FIGS. 19 and 20, as described above, the case 201 may further have the third introduction hole 208 formed therein. The third introduction hole 208 may be formed in the lower surface of the case 201. External air introduced into the case 201 through the first introduction hole 202, the second introduction hole 204, and/or the third introduction hole 208 may absorb heat generated from the power supply PSU and/or the main board MB, and may be forcibly discharged to the outside of the case 201 through the discharge hole 206 by the fan 240.

External air introduced into the case 201 through the first introduction hole 202, the second introduction hole 204, and/or the third introduction hole 208 may be passed through the heat sink 253 (refer to FIG. 10) by the cooling fan 257 of the transceiver 250, and may be forcibly discharged to the outside of the case 201 through the discharge hole 206 by the fan 240.

The main board MB or the transceiver 250 may be a heat source, the temperature of which is higher than that of the power supply PSU. Therefore, the heat generated from the main board MB may be removed in a forcible air-cooling manner by the fan 240, and the heat generated from the transceiver 250 may be removed in a forcible air-cooling manner by the cooling fan 257.

Referring to FIGS. 1 to 20, a control box according to one aspect of the present disclosure may include a case providing an inner accommodation space and having an opening formed in the upper surface thereof, a first plate supported by the lower surface of the case, a second plate located on the first plate so as to be spaced apart from the first plate, a third plate located on the second plate so as to be spaced apart from the second plate, a rotary plate covering the opening in the case and rotatably mounted to the third plate, and a transceiver located inside the case and coupled to the rotary plate.

According to another aspect of the present disclosure, the transceiver may be pivotably coupled to the rotary plate.

According to another aspect of the present disclosure, the transceiver may include a heat sink and at least one antenna mounted to the heat sink.

According to another aspect of the present disclosure, the heat sink may include a front part formed to allow the at least one antenna to be mounted thereto, a rear part disposed opposite the front part so as to be spaced apart from the front part, a top part interconnecting the upper side of the front part and the upper side of the rear part, and a bottom part interconnecting the lower side of the front part and the lower side of the rear part.

According to another aspect of the present disclosure, the heat sink may include at least one fin located between the top part and the bottom part and extending to interconnect the front part and the rear part.

According to another aspect of the present disclosure, the thickness of the at least one fin may be less than at least one of the thickness of the front part, the thickness of the rear part, the thickness of the top part, or the thickness of the bottom part.

According to another aspect of the present disclosure, the transceiver may further include a cooling fan coupled to one side of the heat sink.

According to another aspect of the present disclosure, the control box may further include a fan, coupled to the upper side of the third plate, and a shock absorber, located between the fan and the third plate.

According to another aspect of the present disclosure, the fan may include an inlet formed in a surface thereof facing the shock absorber, a housing providing a flow passage for air introduced thereinto through the inlet, and an outlet formed in one side of the housing.

According to another aspect of the present disclosure, the shock absorber may have therein a flow passage communicating with the inlet of the fan.

According to another aspect of the present disclosure, the third plate may have therein an opening communicating with the flow passage in the shock absorber.

According to another aspect of the present disclosure, the control box may further include a discharge guide located on the outer periphery of the outlet of the fan. The discharge guide may include a first part extending along the upper edge of the outlet, the first part being located adjacent to the upper edge of the outlet, a second part bent and extending from one end of the first part, the second part being located adjacent to one side edge of the outlet, and a third part bent and extending from the opposite end of the first part, the third part being located adjacent to the opposite side edge of the outlet.

According to another aspect of the present disclosure, the case may further include a discharge hole formed in one surface thereof facing the outlet of the fan, and the discharge guide may be located between the discharge hole and the outlet of the fan.

According to another aspect of the present disclosure, the case may further include at least one introduction hole formed in the opposite surface thereof.

According to another aspect of the present disclosure, the discharge hole may be located closer to the upper surface of the case than the at least one introduction hole.

According to another aspect of the present disclosure, the control box may further include a power supply, located between the first plate and the second plate and mounted on the first plate, and a main board, located between the second plate and the third plate and mounted on the second plate.

According to another aspect of the present disclosure, the amount of heat generated from the main board may be greater than the amount of heat generated from the power supply.

According to another aspect of the present disclosure, the amount of heat generated from the transceiver may be greater than the amount of heat generated from the main board.

According to another aspect of the present disclosure, the control box may further include an insulating layer covering the upper surface of the first plate.

A display device according to another aspect of the present disclosure may include a head including a display panel, and the head may exchange information with the transceiver.

As is apparent from the above description, the display device according the present disclosure has the following effects.

According to at least one embodiment of the present disclosure, there may be provided a control box configured to be wirelessly connected to a head provided with a display panel.

According to at least one embodiment of the present disclosure, there may be provided a stacked structure of components of a control box.

According to at least one embodiment of the present disclosure, there may be provided a mechanism capable of improving the reception rate of an antenna of a wireless control box.

According to at least one embodiment of the present disclosure, there may be provided with a structure capable of effectively dissipating the heat generated in a wireless control box.

The additional scope of applicability of the present disclosure will be apparent from the above detailed description. However, those skilled in the art will appreciate that various modifications and alterations are possible, without departing from the idea and scope of the present disclosure, and therefore it should be understood that the detailed description and specific embodiments, such as the preferred embodiments of the present disclosure, are provided only for illustration.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A control box comprising:
a case providing an inner accommodation space, the case having an opening formed in an upper surface thereof;

a first plate supported by a lower surface of the case;
a second plate located on the first plate, the second plate being spaced apart from the first plate;
a third plate located on the second plate, the third plate being spaced apart from the second plate;
a rotary plate covering the opening, the rotary plate being rotatably mounted to the third plate; and
a transceiver located inside the case, the transceiver being coupled to the rotary plate, wherein the transceiver is pivotably coupled to the rotary plate.

2. A display device comprising:
a head comprising a display panel,
wherein the head exchanges information with the transceiver of the control box described in claim 1.

3. A control box comprising:
a case providing an inner accommodation space, the case having an opening formed in an upper surface thereof;
a first plate supported by a lower surface of the case;
a second plate located on the first plate, the second plate being spaced apart from the first plate;
a third plate located on the second plate, the third plate being spaced apart from the second plate;
a rotary plate covering the opening, the rotary plate being rotatably mounted to the third plate; and
a transceiver located inside the case, the transceiver being coupled to the rotary plate,
wherein the transceiver comprises:
a heat sink; and
at least one antenna mounted to the heat sink, and
wherein the heat sink comprises:
a front part on which the at least one antenna to be mounted;
a rear part facing the front part, the rear part being spaced apart from the front part;
a top part connecting an upper side of the front part and an upper side of the rear part; and
a bottom part connecting a lower side of the front part and a lower side of the rear part.

4. The control box according to claim 3, wherein the heat sink comprises:
at least one fin located between the top part and the bottom part, the at least one fin extending to connect the front part and the rear part.

5. The control box according to claim 4, wherein a thickness of the at least one fin is smaller than at least one of a thickness of the front part, a thickness of the rear part, a thickness of the top part, or a thickness of the bottom part.

6. The control box according to claim 5, wherein the transceiver further comprises:
a cooling fan coupled to one side of the heat sink.

7. The control box according to claim 3, further comprising:
a fan coupled to an upper side of the third plate; and
a shock absorber located between the fan and the third plate.

8. The control box according to claim 7, wherein the fan comprises:
an inlet formed in a surface thereof facing the shock absorber;
a housing providing a flow passage for air introduced thereinto through the inlet; and
an outlet formed in one side of the housing.

9. The control box according to claim 8, wherein the shock absorber includes a flow passage communicating with the inlet of the fan.

10. The control box according to claim 9, wherein the third plate includes an opening communicating with the flow passage in the shock absorber.

11. The control box according to claim 8, further comprising:
a discharge guide located on an outer periphery of the outlet of the fan,
wherein the discharge guide comprises:
a first part extending along an upper edge of the outlet, the first part being located adjacent to the upper edge of the outlet;
a second part bent and extending from one end of the first part, the second part being located adjacent to one side edge of the outlet; and
a third part bent and extending from an opposite end of the first part, the third part being located adjacent to an opposite side edge of the outlet.

12. The control box according to claim 11, wherein the case further comprises:
a discharge hole formed in one surface of the case, the discharge hole facing the outlet of the fan, and
wherein the discharge guide is located between the discharge hole and the outlet of the fan.

13. The control box according to claim 12, wherein the case further comprises:
at least one introduction hole formed in another surface of the case.

14. The control box according to claim 13, wherein the discharge hole is located closer to an upper surface of the case than the at least one introduction hole.

15. A control box comprising:
a case providing an inner accommodation space, the case having an opening formed in an upper surface thereof;
a first plate supported by a lower surface of the case;
a second plate located on the first plate, the second plate being spaced apart from the first plate;
a third plate located on the second plate, the third plate being spaced apart from the second plate;
a rotary plate covering the opening, the rotary plate being rotatably mounted to the third plate;
a transceiver located inside the case, the transceiver being coupled to the rotary plate;
a power supply located between the first plate and the second plate, the power supply being mounted on the first plate; and
a main board located between the second plate and the third plate, the main board being mounted on the second plate.

16. The control box according to claim 15, wherein an amount of heat generated from the main board is greater than an amount of heat generated from the power supply.

17. The control box according to claim 16, wherein an amount of heat generated from the transceiver is greater than an amount of heat generated from the main board.

18. The control box according to claim 15, further comprising:
an insulating layer covering an upper surface of the first plate.

* * * * *